(12) United States Patent
Guo et al.

(10) Patent No.: US 10,811,466 B2
(45) Date of Patent: Oct. 20, 2020

(54) ORGANIC LIGHT EMITTING DISPLAY PANEL AND METHOD FOR MANUFACTURING THE SAME

(71) Applicant: WUHAN CHINA STAR OPTOELECTRONICS SEMICONDUCTOR DISPLAY TECHNOLOGY CO., LTD., Wuhan, Hubei (CN)

(72) Inventors: Tianfu Guo, Hubei (CN); Hsianglun Hsu, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/334,016

(22) PCT Filed: Dec. 21, 2018

(86) PCT No.: PCT/CN2018/122577
§ 371 (c)(1),
(2) Date: Mar. 17, 2019

(87) PCT Pub. No.: WO2020/037907
PCT Pub. Date: Feb. 27, 2020

(65) Prior Publication Data
US 2020/0127056 A1 Apr. 23, 2020

(51) Int. Cl.
*H01L 27/32* (2006.01)
*H01L 51/00* (2006.01)
(Continued)

(52) U.S. Cl.
CPC ........ *H01L 27/322* (2013.01); *H01L 27/3211* (2013.01); *H01L 27/3244* (2013.01);
(Continued)

(58) Field of Classification Search
None
See application file for complete search history.

(56) References Cited

U.S. PATENT DOCUMENTS 6,911,772 B2 * 6/2005 Cok .............. H01L 27/3211
313/113
8,809,838 B2 * 8/2014 Jeong ............ H01L 51/5268
257/40
(Continued)

FOREIGN PATENT DOCUMENTS

| CN | 104022139 A | 9/2014 |
| CN | 106104841 A | 11/2016 |
| JP | 2005293946 A | 10/2005 |

*Primary Examiner* — Andres Munoz
(74) *Attorney, Agent, or Firm* — Mark M. Friedman

(57) ABSTRACT

An organic light emitting diode display panel includes a thin film transistor array layer disposed on a flexible substrate, and including thin film transistors, a reflective anode, and a pixel defining layer. The pixel defining layer has a patterned structure defining non-light emitting regions and light emitting regions, each being between the non-light emitting regions; a black matrix layer disposed on the non-light emitting regions; a light emitting module disposed on a surface of the black matrix layer and the pixel defining layer, and including a plurality of pixel units. Each pixel unit includes a red subpixel, a green subpixel, and a blue subpixel respectively correspondingly disposed in one light emitting region and disposed on the reflective anode; a filter film layer including a red filter, a green filter, and a blue filter respectively correspondingly disposed on one red subpixel, one green subpixel and one blue subpixel.

14 Claims, 6 Drawing Sheets

(51) Int. Cl.
*H01L 51/52* (2006.01)
*H01L 51/56* (2006.01)

(52) U.S. Cl.
CPC ...... *H01L 27/3246* (2013.01); *H01L 51/0097* (2013.01); *H01L 51/5218* (2013.01); *H01L 51/5253* (2013.01); *H01L 51/5284* (2013.01); *H01L 51/56* (2013.01); *H01L 2227/323* (2013.01)

(56) References Cited

U.S. PATENT DOCUMENTS

| | | | | |
|---|---|---|---|---|
| 8,921,840 | B2* | 12/2014 | Kim | H01L 51/5275 257/40 |
| 2003/0107314 | A1* | 6/2003 | Urabe | H01L 51/5284 313/506 |
| 2004/0007973 | A1* | 1/2004 | Utsumi | G02F 1/136209 313/506 |
| 2005/0140276 | A1* | 6/2005 | Park | H01L 27/322 313/504 |
| 2005/0269947 | A1* | 12/2005 | Kobayashi | H01L 27/322 313/504 |
| 2008/0042146 | A1* | 2/2008 | Cok | H01L 27/322 257/79 |
| 2010/0171107 | A1* | 7/2010 | Jung | H01L 51/5231 257/40 |
| 2014/0035456 | A1 | 2/2014 | Isa | |
| 2015/0008403 | A1* | 1/2015 | Kudo | H01L 51/5271 257/40 |
| 2015/0187857 | A1 | 7/2015 | Negishi et al. | |
| 2015/0349291 | A1 | 12/2015 | Song et al. | |
| 2015/0362776 | A1* | 12/2015 | Jikumaru | H01L 27/1248 349/12 |
| 2016/0087018 | A1* | 3/2016 | Shim | H01L 51/5275 257/40 |
| 2018/0294317 | A1 | 10/2018 | Wolk et al. | |

* cited by examiner

ORGANIC LIGHT EMITTING DISPLAY PANEL AND METHOD FOR MANUFACTURING THE SAME

FIELD OF THE INVENTION

The present disclosure relates to the technical field of display technologies, and in particular to an organic light emitting display panel and a method for manufacturing the same.

BACKGROUND OF DISCLOSURE

Organic light emitting diode (OLED) devices have the advantages of light weight, wide viewing angle, fast response time, durability for low temperature, high luminous efficiency, etc., and have been regarded as the next generation of display technology which may completely replace liquid crystal display panels. Especially, OLEDs may be made into a bendable flexible display on a flexible substrate, which is a huge advantage for OLEDs.

Compared with conventional LCD displays, the most important feature of OLED displays is self-luminescence of organic luminescent material in OLED devices. However, OLED displays still face the challenge of environmental interference. When external light enters the interior of an OLED device, the light irradiates the anodes inside the device and is reflected outward from the device by the anodes, thereby affecting the display contrast. In order to effectively resist ambient light and reduce display interference, the main solution in the current industry is to equip a circular polarizer. At present, the circular polarizer is an anti-reflective film formed by combining a ¼ wavelength phase film with a conventional polarizer. However, if the circular polarizer is mounted on an OLED device, the thickness of the OLED device is greatly increased, thereby greatly affecting the flexibility of the OLED display, and hindering the flexibility development of OLED devices. Moreover, the another major disadvantage of using the circular polarizer is that the polarizer not only effectively prevents external light from entering the interior of the OLED device, and also greatly reduces the light emitted from the OLED itself, so that the overall light emitting efficiency of the OLED device is greatly reduced. Therefore, how to manufacture an optical film replacing the circular polarizer has a great research and development value.

SUMMARY OF INVENTION

Technical Problems

An primary object of the present disclosure is to provide an organic light emitting display panel and a method for manufacturing the same, which prevent external light from entering the interior of the organic light emitting diode device and being reflected outward from the device, thereby preventing the external light from interfering with the display contrast of the organic light emitting display, reducing the thickness of the organic light emitting diode device, and improving the flexibility thereof.

Technical Solutions

The present disclosure provides an organic light emitting diode display panel comprising:
a flexible substrate;
a thin film transistor array layer disposed on the flexible substrate, and including a plurality of thin film transistors, a reflective anode, and a pixel defining layer, wherein the pixel defining layer has a patterned structure defining non-light emitting regions and light emitting regions, and each of the light emitting regions is between the non-light emitting regions;
a black matrix layer disposed on the non-light emitting regions of the pixel defining layer;
a light emitting module disposed on a surface of the black matrix layer and the pixel defining layer, and including a plurality of pixel units, wherein each of the pixel units includes a red subpixel, a green subpixel, and a blue subpixel, and the red subpixel, the green subpixel, and the blue subpixel are respectively correspondingly disposed in one of the light emitting regions, and are disposed on the reflective anode;
a filter film layer including a red filter, a green filter, and a blue filter, wherein the red filter, the green filter, and the blue filter are respectively correspondingly disposed on one of the red subpixels, one of the green subpixels and one of the blue subpixels of the light emitting module; and
an encapsulation layer disposed on the light emitting module.

In a preferred embodiment, a light transmissive film is disposed on the filter film layer and has a refractive index higher than a refractive index of the filter film layer, so that light emitted from the light emitting module is concentrated toward the filter film layer.

In a preferred embodiment, the red filter, the green filter, and the blue filter of the filter film layer are respectively formed with uneven surfaces.

In a preferred embodiment, each of the uneven surfaces has a continuously curved arcuate convex surface, a continuously curved arcuate concave surface, or a serrated surface.

In a preferred embodiment, a thickness of the black matrix layer is greater than a thickness of the filter film layer.

In a preferred embodiment, the light emitting module includes a hole injection layer, an organic light emitting layer, an electron transport layer, a cover layer, and a protective layer; the red subpixels, the green subpixels, and the blue subpixels are formed on the organic light emitting layer.

The present disclosure provides a method for manufacturing an organic light emitting diode display panel, comprising:
providing a flexible substrate;
forming a thin film transistor array layer on the flexible substrate, wherein the thin film transistor array layer includes a plurality of thin film transistors, a reflective anode, and a pixel defining layer, the pixel defining layer has a patterned structure defining non-light emitting regions and light emitting regions, and each of the light emitting regions is between the non-light emitting regions;
coating a black matrix layer on the pixel defining layer, and correspondingly forming the black matrix layer on the non-light emitting regions by an exposure process and a development process;
forming a light emitting module on a surface of the black matrix layer and the pixel defining layer, wherein the light emitting module includes a plurality of pixel units, and each of the pixel units includes a red subpixel, a green subpixel, and a blue subpixel, and the red subpixel, the green subpixel, and the blue subpixel are respectively correspondingly disposed in one of the light emitting regions, and are disposed on the reflective anode;

forming a filter film layer on the red subpixels, the green subpixels, and the blue subpixels of the light emitting module, wherein the filter film layer includes a red filter, a green filter, and a blue filter, and the red filter, the green filter, and the blue filter are respectively correspondingly formed on one of the red subpixels, one of the green subpixels and one of the blue subpixels of the light emitting module; and forming an encapsulation layer on the light emitting module.

In a preferred embodiment, a light transmissive film is disposed on the filter film layer and has a refractive index higher than a refractive index of the filter film layer, so that light emitted from the light emitting module is concentrated toward the filter film layer.

In a preferred embodiment, the red filter, the green filter, and the blue filter of the filter film layer are respectively formed with uneven surfaces.

In a preferred embodiment, each of the uneven surfaces has a continuously curved arcuate convex surface, a continuously curved arcuate concave surface, or a serrated surface.

In a preferred embodiment, a thickness of the black matrix layer is greater than a thickness of the filter film layer.

In a preferred embodiment, the light emitting module includes a hole injection layer, an organic light emitting layer, an electron transport layer, a cover layer, and a protective layer; the red subpixels, the green subpixels, and the blue subpixels are formed on the organic light emitting layer.

The present disclosure also provides an organic light emitting diode display panel comprising:

a flexible substrate;

a thin film transistor array layer disposed on the flexible substrate, and including a pixel defining layer, wherein the pixel defining layer has a patterned structure defining non-light emitting regions and light emitting regions, and each of the light emitting regions is between the non-light emitting regions;

a black matrix layer disposed on the non-light emitting regions of the pixel defining layer;

a light emitting module disposed on a surface of the black matrix layer and the pixel defining layer, and including a plurality of pixel units, wherein each of the pixel units includes a red subpixel, a green subpixel, and a blue subpixel, and the red subpixel, the green subpixel, and the blue subpixel are respectively correspondingly disposed in one of the light emitting regions, and are disposed on the reflective anode;

a filter film layer including a red filter, a green filter, and a blue filter, wherein the red filter, the green filter, and the blue filter are respectively correspondingly disposed on one of the red subpixels, one of the green subpixels and one of the blue subpixels of the light emitting module, and the red filter, the green filter, and the blue filter of the filter film layer are respectively formed with uneven surfaces; and an encapsulation layer disposed on the light emitting module, wherein a light transmissive film is disposed on the filter film layer and has a refractive index higher than a refractive index of the filter film layer, so that light emitted from the light emitting module is concentrated toward the filter film layer.

In a preferred embodiment, each of the uneven surfaces has a continuously curved arcuate convex surface, a continuously curved arcuate concave surface, or a serrated surface.

In a preferred embodiment, a thickness of the black matrix layer is greater than a thickness of the filter film layer.

In a preferred embodiment, the light emitting module includes a hole injection layer, an organic light emitting layer, an electron transport layer, a cover layer, and a protective layer; the red subpixels, the green subpixels, and the blue subpixels are formed on the organic light emitting layer.

Beneficial Effects

In the organic light emitting display panel of the present disclosure, by using the diffuse reflection effect generated by the red, green and blue filter film layers with the uneven surfaces in combination with the black matrix layer made by black light absorbing material, the light in the non-red band, the non-green band or the non-blue band entering the interior of the light emitting diode (OLED) device is absorbed, and the external light entering the OLED device is prevented from being reflected outward from the device, thereby preventing the external light from interfering with the display contrast of the OLED display. In addition, since the device does not include any anti-reflective film formed by combining a conventional circular polarizer phase film with a conventional polarizer, the thickness of the OLED device may be reduced, and the flexibility thereof may be improved. Therefore, the defects are effectively resolved that the traditional OLED display panel is easily interfered by the external light, thereby affecting the light emitting efficiency and the display contrast, and the thickness is too large.

DETAILED DESCRIPTION OF PREFERRED EMBODIMENTS

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure.

The present disclosure provides an organic light emitting display panel, which not only has the characteristics of self-luminescence of an organic light emitting diode (OLED), but also effectively controls and improves the luminous efficiency of the light emitting layer, by combining a thin film transistor array. In particular, the organic light emitting display panel of the present disclosure improves the defect that external light enters the interior of the organic light emitting diode device and is reflected outward from the device, thereby preventing the external light from interfering with the display contrast of the organic light emitting display, reducing the thickness of the organic light emitting diode device and improving the flexibility thereof.

Figure 1:
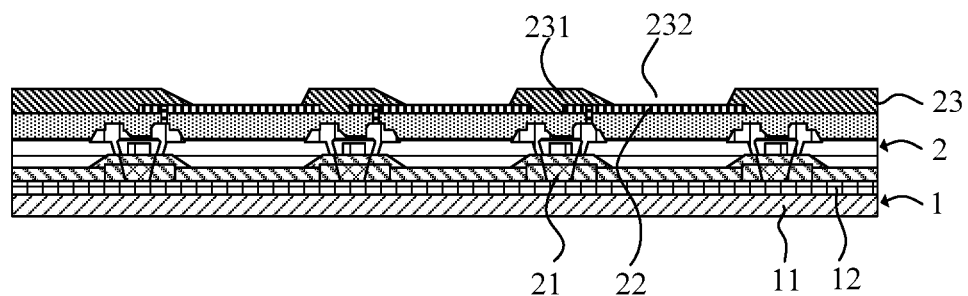
FIG. 1 is a cross-sectional view showing a part of an organic light emitting display panel in accordance with a preferred embodiment of the present disclosure.

FIG. 1 to FIG. 6 are cross-sectional views showing the partial structures of an organic light emitting display panel in accordance with a preferred embodiment of the present disclosure, which may also be used as a description of the manufacturing process thereof. FIG. 1 is a cross-sectional view showing a part of the organic light emitting display panel of the present disclosure. The organic light emitting display panel of the present disclosure includes a flexible substrate 1, which includes a glass substrate 11 and a polyimide (PI) layer 12 formed on the surface of the glass substrate 11. A thin film transistor array layer 2 is disposed on the flexible substrate 1. The main structure of the thin film transistor array layer 2 is the same as that of a conventional thin film transistors array, and includes at least a plurality of thin film transistors 21, reflective anodes 22, and a pixel defining layer 23. The pixel defining layer 23 has a patterned structure formed by etching processes. The patterned structure defines non-light emitting regions 231 and light emitting regions 232 located between the non-light emitting regions 231. The light emitting regions 232 correspond to the reflective anodes 22, and the non-light emitting regions 231 at least correspond to the plurality of thin film transistors 21.

Figure 2:
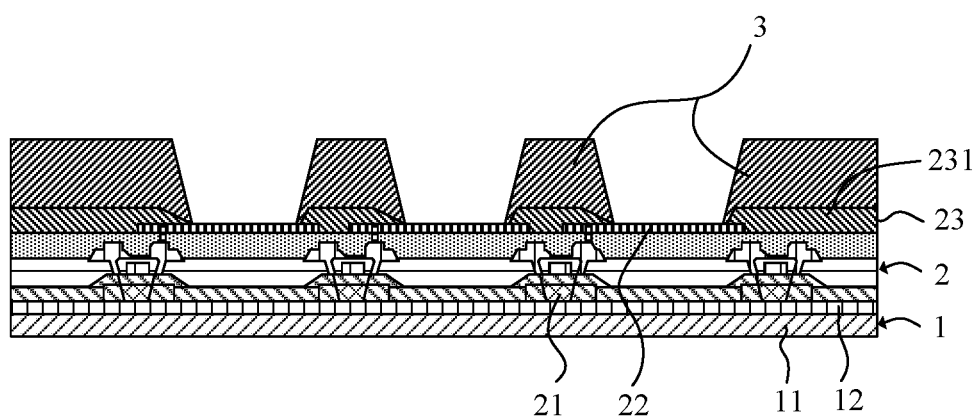
FIG. 2 is another cross-sectional view showing a part of the organic light emitting display panel in accordance with the preferred embodiment of the present disclosure.

FIG. 2 is a cross-sectional view showing a part of the organic light emitting display panel of the present disclosure. Different from the conventional OLED display panel, a black matrix layer 3 is coated on the pixel defining layer 23 in the present disclosure. Specifically, the black matrix layer 3 is correspondingly formed on the non-light emitting regions 231 by exposure processes, development processes, and the like. The black matrix layer 3 is made of a black light absorbing material, such as a photoresist.

Figure 3:
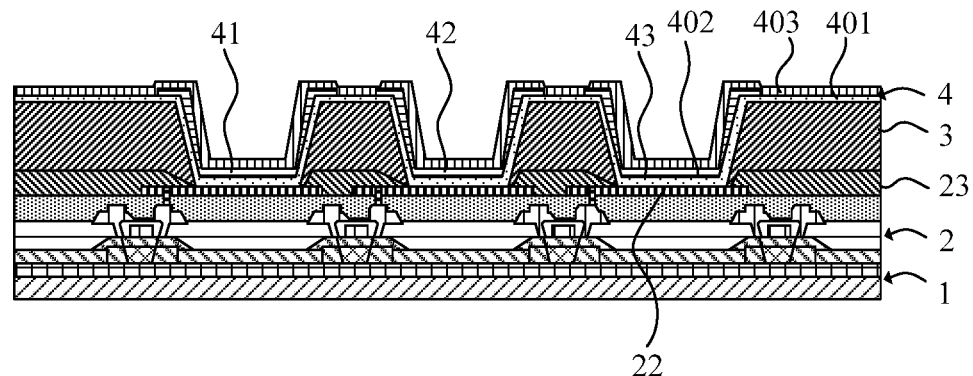
FIG. 3 is another cross-sectional view showing a part of the organic light emitting display panel in accordance with the preferred embodiment of the present disclosure.

As shown in FIG. 3, a light emitting module 4 is disposed on the surface of the black matrix layer 3 and the pixel defining layer 23, and is electrically connected to the thin film transistor array layer 2. Specifically, the light emitting module 4 includes a hole injection layer 401, an organic light emitting layer 402, an electron transport layer, a cover layer, and a lithium fluoride (LiF) protective layer 403, which are respectively formed by deposition processes to form the structure of the light emitting module 4 as shown in FIG. 3. The light emitting module 4 includes a plurality of pixel units, and each of the pixel units includes a plurality of red subpixels 41, green subpixels 42 and blue subpixels 43 formed on the organic light emitting layer 402, which are respectively correspondingly disposed in the light emitting regions 232, and are located on the reflective anodes 22. The light emitting module 4 is turned on by controlling the thin film transistors 21, thereby causing the organic light emitting layer 402 to emit light.

Figure 4:
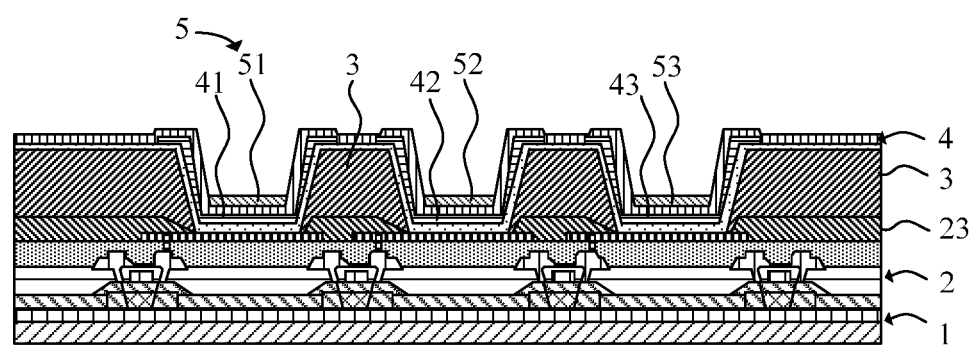
FIG. 4 is another cross-sectional view showing a part of the organic light emitting display panel in accordance with the preferred embodiment of the present disclosure.

As shown in FIG. 4, a filter film layer 5 includes a plurality of red filters 51, green filters 52, and blue filters 53, which are respectively correspondingly disposed on the red subpixels 41, the green subpixels 42 and the blue subpixels 43 of the light emitting module 4. The filter film layer 5 is a color-blocking photoresist. When ambient light irradiates the corresponding red filters 51, green filters 52, and blue filters 53, the purpose of the filter film layer 5 is to allow the light in the red band, the green band and the blue band in the ambient light to pass the red filters 51, the green filters 52 and the blue filters 53 correspondingly, but light in other bands is reflected. In addition, the thickness of the black matrix layer 3 is greater than the thickness of the filter film layer 5, so that the black matrix layer 3 is adjacent to and protrudes from the red filters 51, the green filters 52, and the blue filters 53.

Figure 5:
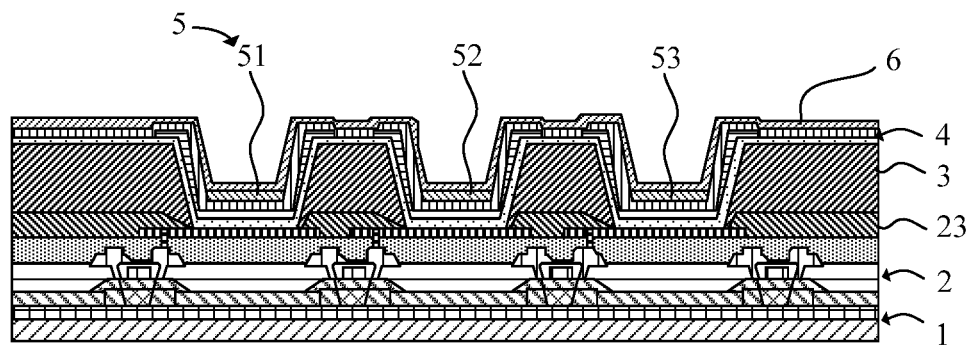
FIG. 5 is another cross-sectional view showing a part of the organic light emitting display panel in accordance with the preferred embodiment of the present disclosure.

FIG. 5 is another cross-sectional view showing a part of the organic light emitting display panel of the preferred embodiment of the present disclosure. As shown in FIG. 5, an extreme thin light transmissive film 6 is disposed on the filter film layer 5, and the thin light transmissive film 6 may be made of titanium dioxide (TiO2), zirconium dioxide (ZrO2), or silicon carbon nitride (SiCN) and formed by atomic layer deposition processes. The light transmissive film 6 has a refractive index which is higher than the refractive index of the filter film layer 5. The light transmissive film 6 is disposed on the filter film layer 5 to maximally maintain the light reflection topography of the surface of the filter film layer 5.

Figure 7A:
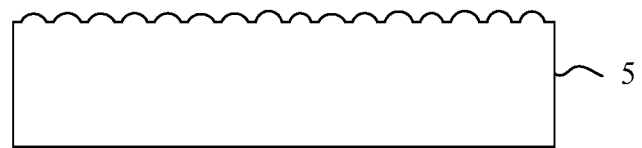
FIG. 7A is a schematic diagram of a filter film layer in accordance with a preferred embodiment of the present disclosure.
Figure 7B:
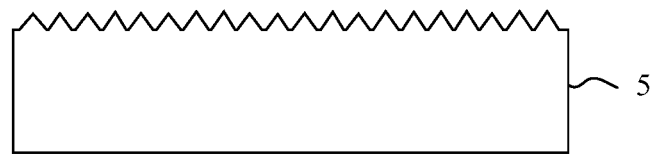
FIG. 7B is another schematic diagram of a filter film layer in accordance with a preferred embodiment of the present disclosure.
Figure 7C:
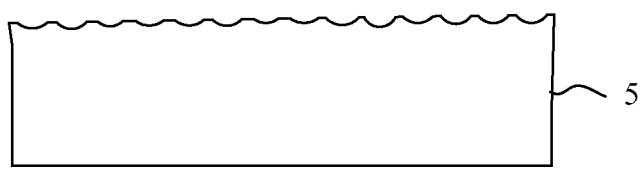
FIG. 7C is another schematic diagram of a filter film layer in accordance with a preferred embodiment of the present disclosure.
Figure 8:
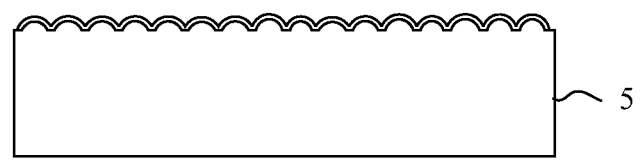
FIG. 8 is a schematic diagram showing a micro optical distribution topography of the filter film layer of FIG. 7A.

Specifically, as shown in FIG. 7A-FIG. 7C, the red filter 51, the green filter 52, and the blue filter 53 are respectively formed with uneven surfaces 50 by photolithography. The uneven surfaces 50 are used to generate an extremely strong light diffusing reflection effect. The uneven surfaces 50 may have different structures. As shown in FIG. 7A, the uneven surfaces 50 have a continuously curved arcuate convex surface. As shown in FIG. 7B, the uneven surfaces 50 have a continuously curved arcuate concave surface. As shown in FIG. 7C, the uneven surface 50 has a serrated surface. Alternatively, in another embodiment, the uneven surfaces 50 may be continuously and alternately formed by evenly or unevenly distributed concave portions and convex portions. In addition, FIG. 8 is a schematic diagram showing a micro optical distribution topography of the filter film layer 5 and the light transmissive film 6 of FIG. 7A.

Figure 6:
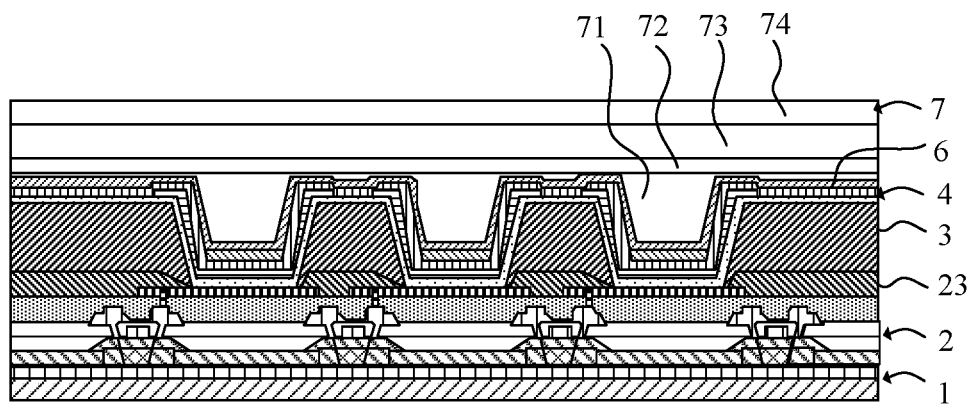
FIG. 6 is another cross-sectional view showing a part of the organic light emitting display panel in accordance with the preferred embodiment of the present disclosure.

FIG. 6 shows a further thin film encapsulation (TFE) process on the structure surface of FIG. 5. That is, an encapsulation layer 7 is disposed on the light transmissive film 6. Specifically, the encapsulation layer 6 includes a thin organic buffer layer 71 disposed on the light transmissive film 6, which is mainly used for wrapping foreign matters on the surface of the OLED during previous manufacturing processes, and planarizing the surface of the OLED device. Then, the first barrier layer 72 is deposited, which may be made of silicon nitride (SiN), silicon carbon nitride (SiCN), silicon dioxide ($SiO_2$) or aluminum oxide ($Al_2O_3$). Afterwards an organic buffer layer 73 is deposited, and a second barrier layer 74 is deposited, which may be made of the same material as the first barrier layer 72, thereby completing the TFE process.

Figure 9:
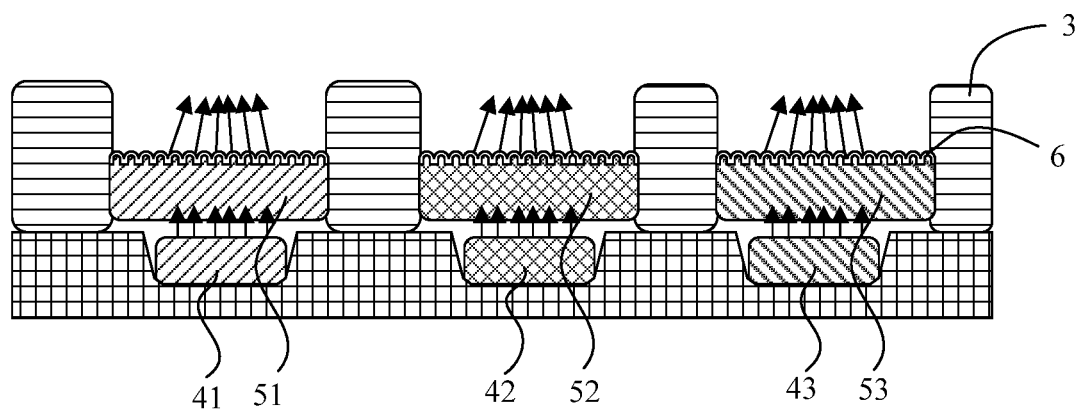
FIG. 9 is a schematic diagram showing light paths of light emitted from the interior of the organic light emitting display panel of the present disclosure.
Figure 10:
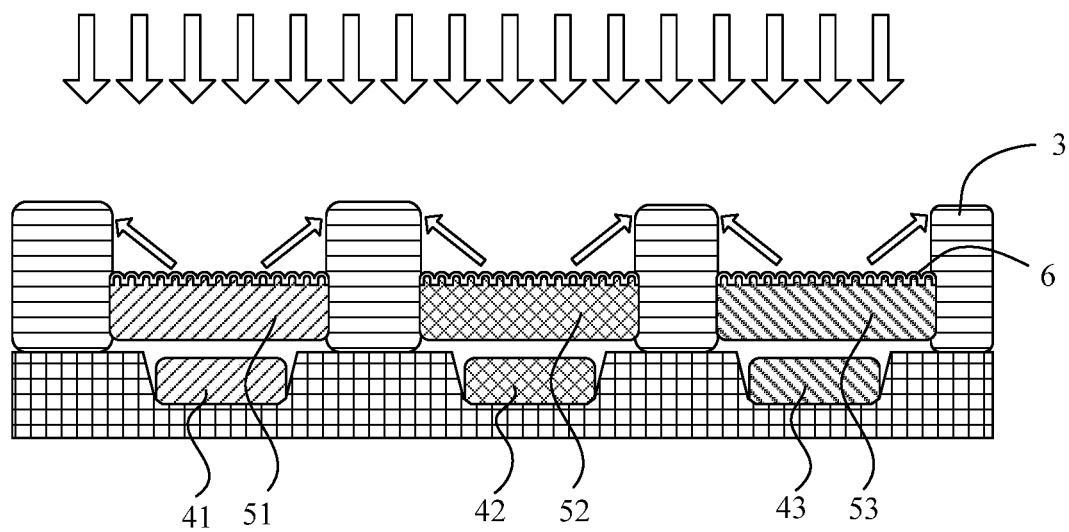
FIG. 10 is a schematic diagram showing light paths after ambient light enters the interior of the organic light emitting display panel of the present disclosure.

FIG. 9 is a schematic diagram showing light paths of light emitted from the interior of the organic light emitting display panel of the present disclosure. When light emitted from the organic light emitting layer 402 inside the organic light emitting display panel of the present disclosure, due to the high refractive index of the surface of the filter film layer 5, the refractive capability of the surface of the light transmissive film 6 is much greater than the material of the filter film layer 5, so that the emitted light direction is changed to make the emitted light as close as possible to the center of the filter film layer 5. That is, the emitted light will shift closer to the red filters 51, the green filters 52, and the blue filters 53, so that the emitted light is far away from the black matrix layer 3 on both sides, and the light loss caused by the black matrix layer 3 can be reduced. FIG. 10 is a schematic diagram showing light paths after ambient light enters the interior of the organic light emitting display panel of the present disclosure. There are a total reflection optical mode and a diffuse reflection optical mode implemented at the interface above the filter film layer 5. Both of the modes are advantageous to transfer the ambient light in the wavelength, which does not pass the filter film layer 5, to the black matrix layer 3 on both sides for absorbing the light.

In the organic light emitting display panel of the present disclosure, by using the diffuse reflection effect generated by the red, green and blue filter film layers with the uneven surfaces in combination with the black matrix layer made by black light absorbing material, the light in the non-red band, the non-green band or the non-blue band entering the interior of the light emitting diode (OLED) device is absorbed, and the external light entering the OLED device is prevented from being reflected outward the device, thereby preventing the external light from interfering with the display contrast of the OLED display. In addition, since the device does not include any anti-reflective film formed by combining a circular polarizer phase film with a conventional polarizer, the thickness of the OLED device can be reduced, and the flexibility thereof may be improved. Therefore, the defects are effectively resolved that the traditional OLED display panel is easily interfered by the external light, thereby affecting the light emitting efficiency and the display contrast, and the thickness is too large.

Figure 11:
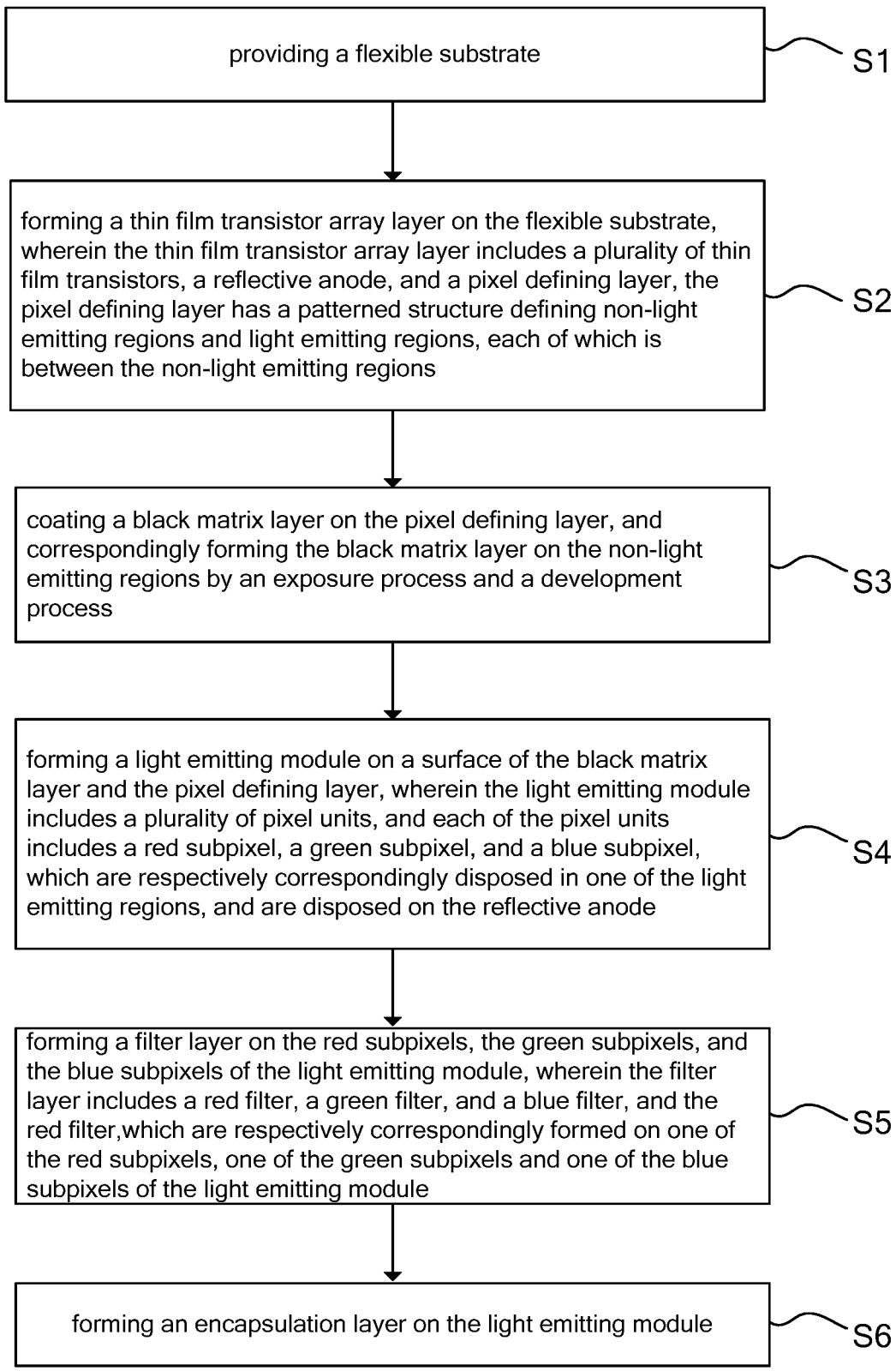
FIG. 11 is a flow chart of a method for manufacturing an organic light emitting display panel of the present disclosure.

The present disclosure further provides a method for manufacturing an organic light emitting display panel. FIG. 11 is a flow chart of a method for manufacturing an organic light emitting diode display panel of the present disclosure. The method includes the following steps: Step S1: a flexible substrate is provided. Specifically, a polyimide (PI) layer is formed on the surface of a clean glass substrate.

Step S2: a thin film transistor array layer is formed on the flexible substrate. The thin film transistor array layer includes a plurality of thin film transistors, reflective anodes, and a pixel defining layer. The pixel defining layer has a patterned structure defining non-light emitting regions and light emitting regions, and each of the light emitting regions is between the non-light emitting regions.

Step S3: a black matrix layer is coated on the pixel defining layer. Specifically, the black matrix layer is correspondingly formed on the non-light emitting regions by processes, such as exposure processes, development processes, or the like.

Step S4: a light emitting module is formed on the surface of the black matrix layer and the pixel defining layer. The light emitting module includes a plurality of pixel units, and each of the pixel units includes red subpixels, green subpixels, and blue subpixels. The red subpixels, the green subpixels, and the blue subpixels are respectively correspondingly disposed in one of the light emitting regions, and are disposed on the reflective anodes.

Step S5: a filter film layer is formed on the red subpixels, the green subpixels, and the blue subpixels of the light emitting module. The filter film layer includes red filters, green filters, and blue filters. The red filters, the green filters, and the blue filters are respectively correspondingly formed on one of the red subpixels, one of the green subpixels and one of the blue subpixels of the light emitting module.

Step S6: an encapsulation layer is formed on the light emitting module.

In addition, a light transmissive film is formed on the filter film layer by atomic layer deposition process, and the light transmissive film has a refractive index higher than the refractive index of the filter film layer, so that the light emitted by the luminescent layer is concentrated toward the filter film layer.

The configurations of the organic light emitting display panel manufactured in accordance with the method of the present disclosure have been described in the previous paragraphs and will not be redundantly repeated herein.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. An organic light emitting diode display panel comprising:
    a flexible substrate;
    a thin film transistor array layer disposed on the flexible substrate, and including a plurality of thin film transistors, a reflective anode, and a pixel defining layer, wherein the pixel defining layer has a patterned structure defining non-light emitting regions and light emitting regions, and each of the light emitting regions is between the non-light emitting regions;
    a black matrix layer disposed on the non-light emitting regions of the pixel defining layer;
    a light emitting module disposed on a surface of the black matrix layer and the pixel defining layer, and including a plurality of pixel units, wherein each of the plurality of pixel units includes a red subpixel, a green subpixel, and a blue subpixel, and the red subpixel, the green subpixel, and the blue subpixel are respectively correspondingly disposed in one of the light emitting regions, and are disposed on the reflective anode;
    a filter film layer including a red filter, a green filter, and a blue filter, wherein the red filter, the green filter, and the blue filter are respectively correspondingly disposed on one of the red subpixels, one of the green subpixels and one of the blue subpixels of the light emitting module;
    a light transmissive film disposed on the filter film layer and having a refractive index higher than a refractive index of the filter film layer, so that light emitted from the light emitting module is concentrated toward the filter film layer; and an encapsulation layer disposed on the light emitting module.

2. The organic light emitting diode display panel as claimed in claim 1, wherein the red filter, the green filter, and the blue filter of the filter film layer are respectively formed with uneven surfaces.

3. The organic light emitting diode display panel as claimed in claim 2, wherein each of the uneven surfaces has a continuously curved arcuate convex surface, a continuously curved arcuate concave surface, or a serrated surface.

4. The organic light emitting diode display panel as claimed in claim 1, wherein a thickness of the black matrix layer is greater than a thickness of the filter film layer.

5. The organic light emitting diode display panel as claimed in claim 1, wherein the light emitting module includes:
   a hole injection layer,
   an organic light emitting layer, and
   a protective layer;
   wherein the red subpixels, the green subpixels, and the blue subpixels are formed on the organic light emitting layer.

6. A method for manufacturing an organic light emitting diode display panel, comprising:
   providing a flexible substrate;
   forming a thin film transistor array layer on the flexible substrate, wherein the thin film transistor array layer includes a plurality of thin film transistors, a reflective anode, and a pixel defining layer, the pixel defining layer has a patterned structure defining non-light emitting regions and light emitting regions, and each of the light emitting regions is between the non-light emitting regions;
   coating a black matrix layer on the pixel defining layer, and correspondingly forming the black matrix layer on the non-light emitting regions by an exposure process and a development process;
   forming a light emitting module on a surface of the black matrix layer and the pixel defining layer, wherein the light emitting module includes a plurality of pixel units, and each of the plurality of pixel units includes a red subpixel, a green subpixel, and a blue subpixel, and the red subpixel, the green subpixel, and the blue subpixel are respectively correspondingly disposed in one of the light emitting regions, and are disposed on the reflective anode;
   forming a filter film layer on the red subpixels, the green subpixels, and the blue subpixels of the light emitting module, wherein the filter film layer includes a red filter, a green filter, and a blue filter, and the red filter, the green filter, and the blue filter are respectively correspondingly formed on one of the red subpixels, one of the green subpixels and one of the blue subpixels of the light emitting module;
   forming a light transmissive film on the filter film layer with a refractive index higher than a refractive index of the filter film layer, so that light emitted from the light emitting module is concentrated toward the filter film layer; and
   forming an encapsulation layer on the light emitting module.

7. The method for manufacturing an organic light emitting diode display panel as claimed in claim 6, wherein the red filter, the green filter, and the blue filter of the filter film layer are respectively formed with uneven surfaces.

8. The method for manufacturing an organic light emitting diode display panel as claimed in claim 7, wherein each of the uneven surfaces has a continuously curved arcuate convex surface, a continuously curved arcuate concave surface, or a serrated surface.

9. The method for manufacturing an organic light emitting diode display panel as claimed in claim 6, wherein a thickness of the black matrix layer is greater than a thickness of the filter film layer.

10. The method for manufacturing an organic light emitting diode display panel as claimed in claim 6, wherein the light emitting module includes:
    a hole injection layer,
    an organic light emitting layer, and
    a protective layer;
    wherein the red subpixels, the green subpixels, and the blue subpixels are formed on the organic light emitting layer.

11. An organic light emitting diode display panel comprising:
    a flexible substrate;
    a thin film transistor array layer disposed on the flexible substrate, and including a pixel defining layer, wherein the pixel defining layer has a patterned structure defining non-light emitting regions and light emitting regions, and each of the light emitting regions is between the non-light emitting regions;
    a black matrix layer disposed on the non-light emitting regions of the pixel defining layer;
    a light emitting module disposed on a surface of the black matrix layer and the pixel defining layer, and including a plurality of pixel units, wherein each of the plurality of pixel units includes a red subpixel, a green subpixel, and a blue subpixel, and the red subpixel, the green subpixel, and the blue subpixel are respectively correspondingly disposed in one of the light emitting regions, and are disposed on the reflective anode;
    a filter film layer including a red filter, a green filter, and a blue filter, wherein the red filter, the green filter, and the blue filter are respectively correspondingly disposed on one of the red subpixels, one of the green subpixels and one of the blue subpixels of the light emitting module, and the red filter, the green filter, and the blue filter of the filter film layer are respectively formed with uneven surfaces; and
    an encapsulation layer disposed on the light emitting module;
    wherein a light transmissive film is disposed on the filter film layer and has a refractive index higher than a refractive index of the filter film layer, so that light emitted from the light emitting module is concentrated toward the filter film layer.

12. The organic light emitting diode display panel as claimed in claim 11, wherein each of the uneven surfaces has a continuously curved arcuate convex surface, a continuously curved arcuate concave surface, or a serrated surface.

13. The organic light emitting diode display panel as claimed in claim 11, wherein a thickness of the black matrix layer is greater than a thickness of the filter film layer.

14. The organic light emitting diode display panel as claimed in claim 11, wherein the light emitting module includes:
    a hole injection layer,
    an organic light emitting layer, and
    a protective layer;

wherein the red subpixels, the green subpixels, and the blue subpixels are formed on the organic light emitting layer.

\* \* \* \* \*

UNITED STATES PATENT AND TRADEMARK OFFICE
CERTIFICATE OF CORRECTION

| | |
|---|---|
| PATENT NO. | : 10,811,466 B2 |
| APPLICATION NO. | : 16/334016 |
| DATED | : October 20, 2020 |
| INVENTOR(S) | : Tianfu Guo and Hsianglun Hsu |

Page 1 of 1

It is certified that error appears in the above-identified patent and that said Letters Patent is hereby corrected as shown below:

(30) Foreign Application Priority Data:
Change: (Absent information)
To "August 20, 2018 (CN) 201810947263.1"

Signed and Sealed this
Twenty-second Day of December, 2020

Andrei Iancu
*Director of the United States Patent and Trademark Office*